United States Patent
Tanaka

(10) Patent No.: US 9,226,399 B2
(45) Date of Patent: *Dec. 29, 2015

(54) WIRING BOARD WITH BUILT-IN CAPACITOR

(75) Inventor: Hironori Tanaka, Ibi-gun (JP)

(73) Assignee: IBIDEN CO., LTD., Ogaki-shi (JP)

( * ) Notice: Subject to any disclaimer, the term of this patent is extended or adjusted under 35 U.S.C. 154(b) by 1359 days.

This patent is subject to a terminal disclaimer.

(21) Appl. No.: 12/952,234

(22) Filed: Nov. 23, 2010

(65) Prior Publication Data

US 2011/0061921 A1 Mar. 17, 2011

Related U.S. Application Data

(63) Continuation of application No. 11/970,140, filed on Jan. 7, 2008, now abandoned, which is a continuation of application No. 11/474,339, filed on Jun. 26, 2006, now Pat. No. 7,336,501.

(51) Int. Cl.
*H01G 4/00* (2006.01)
*H05K 1/16* (2006.01)
*H05K 1/18* (2006.01)
*H01L 23/498* (2006.01)
*H01L 23/50* (2006.01)
(Continued)

(52) U.S. Cl.
CPC .......... *H05K 1/162* (2013.01); *H01L 23/49822* (2013.01); *H01L 23/50* (2013.01); *H01L 2924/0002* (2013.01); *H01L 2924/3011* (2013.01); *H05K 1/112* (2013.01); *H05K 3/4602* (2013.01); *H05K 3/4641* (2013.01); *H05K 2201/09309* (2013.01); *H05K 2201/09509* (2013.01); *H05K 2201/09672* (2013.01); *H05K 2201/09718* (2013.01); *H05K 2201/10674* (2013.01); *Y10T 29/417* (2015.01); *Y10T 29/4913* (2015.01)

(58) Field of Classification Search
CPC .......................... H05K 1/162; H01L 23/49822
USPC ......... 174/260; 361/301.1, 301.3, 306.2, 761, 361/763, 794
See application file for complete search history.

(56) References Cited

U.S. PATENT DOCUMENTS

| | | |
|---|---|---|
| 5,010,641 A | 4/1991 | Sisler |
| 5,800,575 A | 9/1998 | Lucas |
| 5,870,274 A | 2/1999 | Lucas |

(Continued)

FOREIGN PATENT DOCUMENTS

| | | |
|---|---|---|
| JP | 03-132086 | 6/1991 |
| JP | 05-036857 | 2/1993 |
| JP | 2005-191266 | 7/2005 |

*Primary Examiner* — Carl Arbes
(74) *Attorney, Agent, or Firm* — Oblon, McClelland, Maier & Neustadt, L.L.P.

(57) ABSTRACT

A wiring board with built-in capacitors includes a core substrate, and a high dielectric sheet including a lower electrode layer, an upper electrode layer and a dielectric layer, the dielectric layer made of a sintered ceramic body and sandwiched between the lower electrode layer and the upper electrode layer, the lower electrode layer and/or the upper electrode layer being partitioned into multiple electrodes such that the high dielectric sheet has multiple capacitors. The lower electrode layer and/or the upper electrode layer is connected to a ground line and the other one of the lower electrode layer and the upper electrode layer is connected to a power line such that the capacitors are electrically connected in parallel.

12 Claims, 12 Drawing Sheets

(51) Int. Cl.
    *H05K 1/11*    (2006.01)
    *H05K 3/46*    (2006.01)

(56) References Cited

U.S. PATENT DOCUMENTS

| | | | |
|---|---|---|---|
| 5,926,377 A | 7/1999 | Nakao et al. | |
| 6,395,996 B1 | 5/2002 | Tsai et al. | |
| 6,446,317 B1 | 9/2002 | Figueroa et al. | |
| 6,775,150 B1 | 8/2004 | Chakravorty et al. | |
| 6,969,912 B2 | 11/2005 | Jow et al. | |
| 7,281,321 B2 | 10/2007 | Kim et al. | |
| 7,351,915 B2 | 4/2008 | Ahn et al. | |
| 7,384,856 B2 | 6/2008 | Das et al. | |
| 7,429,510 B2 | 9/2008 | Das et al. | |
| 7,449,381 B2 | 11/2008 | Das et al. | |
| 7,613,007 B2 | 11/2009 | Amey, Jr. et al. | |
| 2005/0098346 A1* | 5/2005 | Fan et al. | 174/260 |
| 2005/0104191 A1 | 5/2005 | Jow et al. | |
| 2005/0128720 A1* | 6/2005 | Croswell et al. | 361/763 |
| 2005/0141169 A1 | 6/2005 | Yamasaki | |
| 2006/0002097 A1 | 1/2006 | Borland et al. | |
| 2006/0113631 A1 | 6/2006 | Yang et al. | |
| 2006/0120015 A1 | 6/2006 | Borland | |
| 2006/0130303 A1* | 6/2006 | Yamasaki et al. | 29/25.41 |
| 2006/0133057 A1 | 6/2006 | McGregor et al. | |
| 2006/0138591 A1 | 6/2006 | Amey et al. | |
| 2006/0154501 A1 | 7/2006 | Das et al. | |
| 2009/0206051 A1 | 8/2009 | Das et al. | |

* cited by examiner

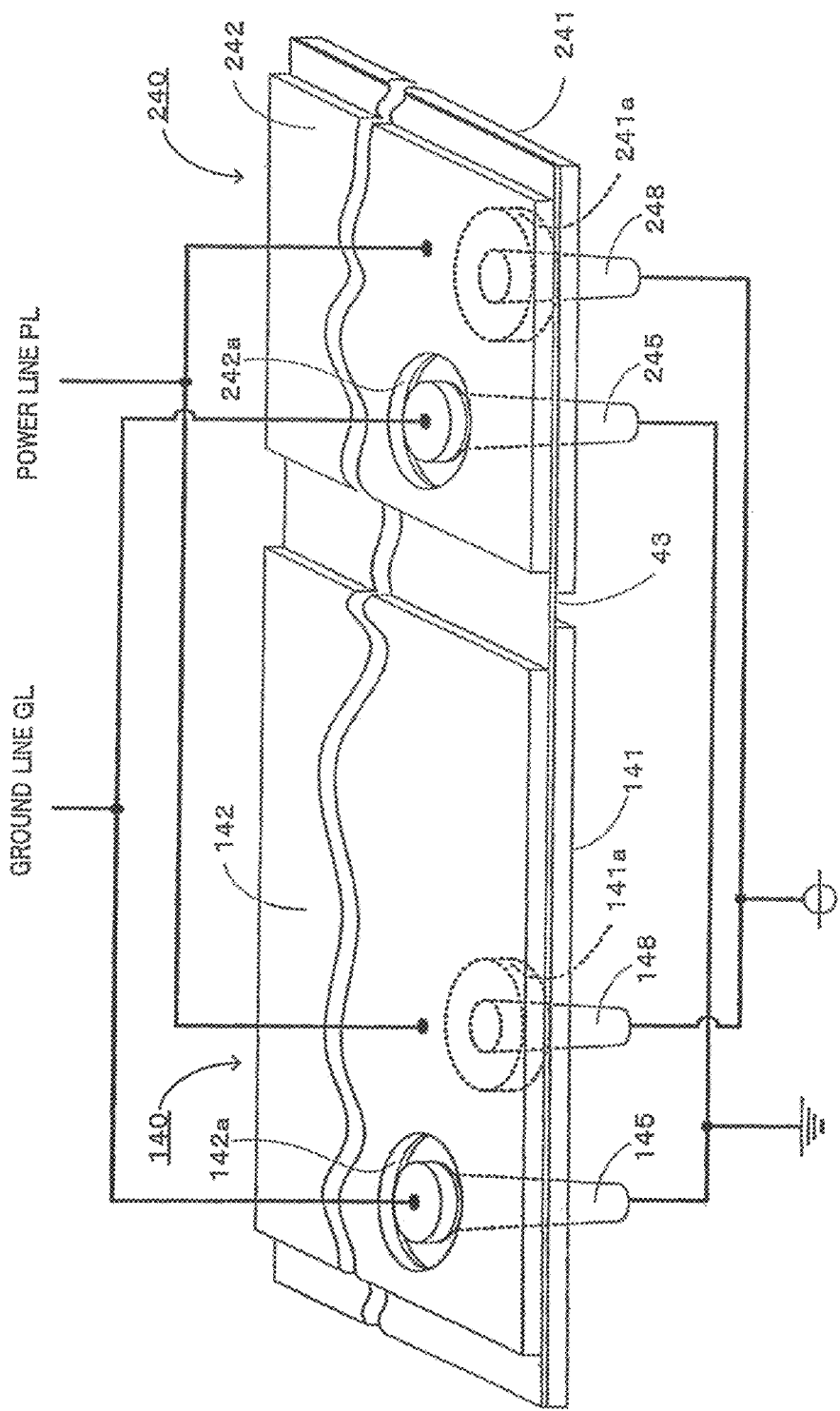

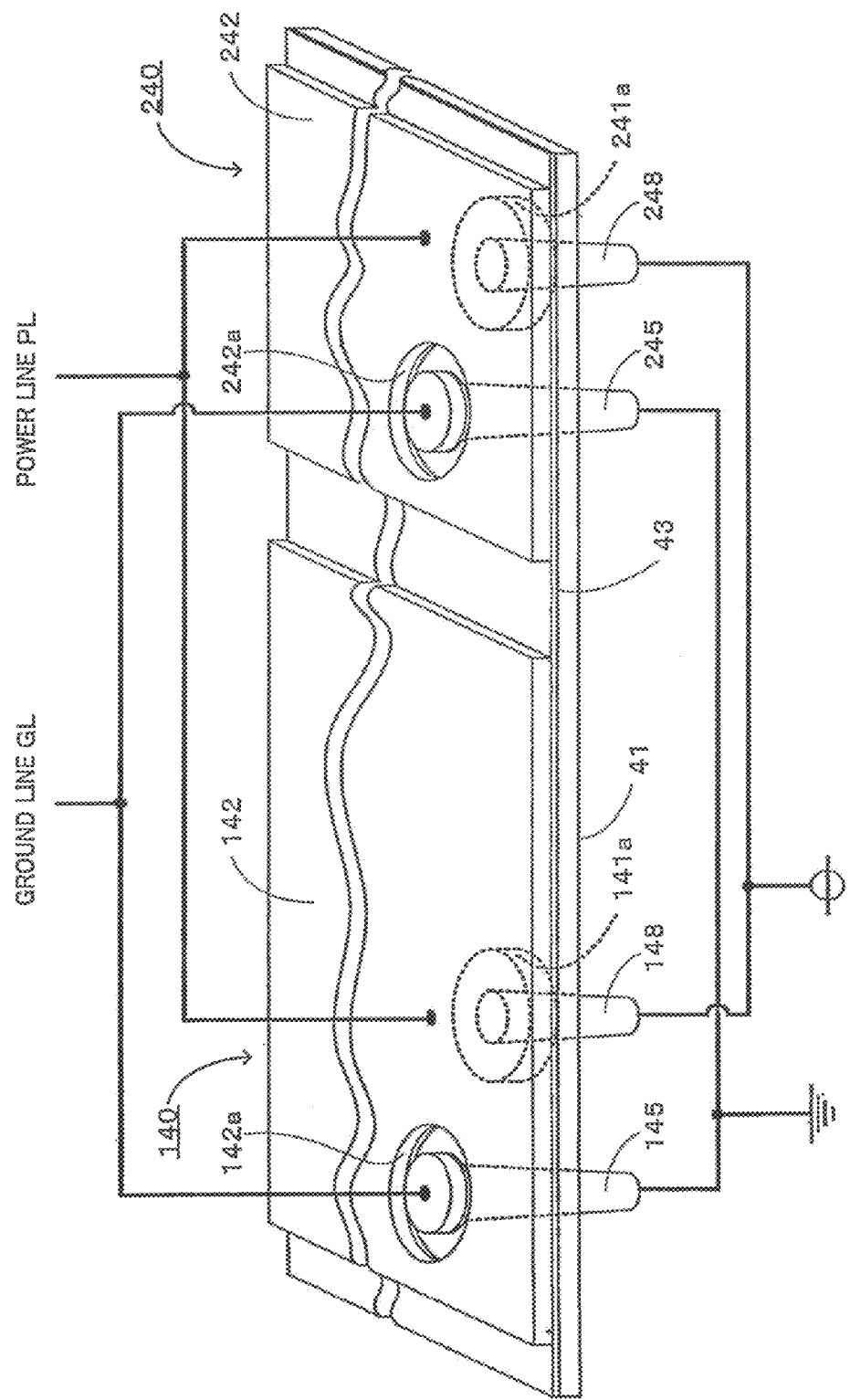

WIRING BOARD WITH BUILT-IN CAPACITOR

CROSS REFERENCE TO RELATED APPLICATIONS

This application is a continuation of and claims the benefit of priority under 35 U.S.C. §120 from U.S. application Ser. No. 11/970,140, filed Jan. 7, 2008, which is a continuation of and claims the benefit of priority under 35 U.S.C. §120 from U.S. Ser. No. 11/474,339, filed Jun. 26, 2006, now U.S. Pat. No. 7,336,501, issued Feb. 26, 2008, the entire contents of each of which are incorporated herein by reference.

BACKGROUND OF THE INVENTION

1. Field of the Invention

The present invention related to a wiring board with built-in capacitors. Specifically, the invention relates to a wiring board with built-in capacitors, which has a multilayer wiring structure and capable of mounting an IC chip thereon.

2. Description of the Prior Art

In a proposed wiring board on which an IC chip can be mounted, a thin film capacitor is connected between a power line and a ground line of the IC chip to realize decoupling and restrain instantaneous lowering of the potential of the power line due to switching noise resulting from high-speed ON/OFF of the mounted IC chip. For example, in a substrate disclosed in Patent Document 1 (JP 2005-191266 A), a plurality of capacitors which are differing in dielectric film thickness are connected in parallel between a power line and a ground line of an IC chip to reduce the impedance across a wider range of frequencies in comparison to a substrate using a single capacitor.

SUMMARY OF THE INVENTION

The present invention is directed to a wiring board with built-in capacitors, that has a multilayer wiring structure and capable of mounting an IC chip thereon. The wiring board with built-in capacitors of the invention includes: a first capacitor that is built into the multilayer wiring structure and formed so that an overlapping area between a first lower electrode and a first upper electrode provided on respective surfaces of a first dielectric layer is a predetermined area; a second capacitor that is built into the multilayer wiring structure along the same plane as the first dielectric layer and formed so that an overlapping area between a second lower electrode and a second upper electrode provided on respective surfaces of a second dielectric layer with the same thickness as the first dielectric layer is different from the predetermined area; a line that electrically connects either one of a power pad for supplying power to the IC chip and a ground pad for grounding the IC chip to either one of the first lower electrode and the second lower electrode; and a line that electrically connects the other of the power pad and the ground pad to the other of the first upper electrode and the second upper electrode.

In this wiring board with built-in capacitors, because the overlapping area between the upper electrode and the lower electrode of the first capacitor differs from the overlapping area (crossover) between the upper electrode and the lower electrode of the second capacitor, the capacitance of the first capacitor differs from the capacitance of the second capacitor. As a result, a state that is the same as connecting a plurality of decoupling capacitors of different capacitances in parallel between the line connected to the power pad and the line connected to the ground pad is realized. Here, although with each of the first and second capacitors, the impedance takes on a minimum value at a corresponding resonance frequency, because the capacitors differ in capacitance, the respective resonant frequencies differ and the impedance is restrained to a low value across a wide frequency range. In addition, because the first and second capacitors are the same in the thickness of the dielectric layer and are disposed in parallel, the respective dielectric layers can be formed more readily in the process of forming the multilayer wiring structure and the first and second capacitors can thus be formed readily in comparison to a case of using dielectric layers that differ in thickness according to each capacitor.

Here, description regards two capacitors that are respectively defined as the first capacitor and the second capacitor in the wiring board of the invention. However, it is obvious that a wiring board with not less than three capacitors is within the scope of the claims of the present invention, as long as some capacitor built into the wiring board meets the requirement of the first capacitor of the invention and other capacitor built into the wiring board meets the requirement of the second capacitor of the invention. In the specification, "same" means to be the same in consideration of errors that may arise in design or in manufacture and applies to cases of complete sameness as well as cases of substantial sameness. Also, in the present specification, the overlapping area between the upper electrode and the lower electrode of each capacitor is preferably set in a range from 150 μm square to 10 mm square. In this case, the different overlapping areas take on different values between an area of 150 μm square and an area of 10 mm square.

In the wiring board with built-in capacitors of the invention, the first dielectric layer and the second dielectric layer may be integrated as a single dielectric layer. Because a single dielectric layer can be used without partitioning, troublesome processes are eliminated and the manufacturing process is simplified in comparison to the case where the first dielectric layer and the second dielectric layer are separated.

In the wiring board with built-in capacitors of the invention, the first dielectric layer and the second dielectric layer may be sintered ceramic bodies. The dielectric constants of the dielectric layers can be adequately high, the first and second capacitors can be high in capacitance and can be functioned as charge supply sources for accommodating instantaneous lowering of power supply voltage. The sintered ceramic body is not restricted in particular, but may be a body formed by sintering a raw material containing one or two or more types of metal oxide selected from the group consisting of barium titanate ($BaTiO_3$), strontium titanate ($SrTiO_3$), tantalum oxide ($TaO_3$, $Ta_2O_5$), lead zirconate titanate (PZT), lead lanthanum zirconate titanate (PLZT), lead niobium zirconate titanate (PNZT), lead calcium zirconate titanate (PCZT), and lead strontium zirconate titanate (PSZT).

In one preferable structure of the wiring board with built-in capacitors of the invention, the first lower electrode and the second lower electrode are separated, the first upper electrode and the second upper electrode are separated, and the overlapping area between the first lower electrode and the first upper electrode is different from the overlapping area between the second lower electrode and the second upper electrode. In another preferable structure of the wiring board with built-in capacitors of the invention, the first lower electrode and the second lower electrode are integrated as a single electrode plate, and the overlapping area between the first upper electrode and the single electrode plate is different from the overlapping area between the second upper electrode and the single electrode plate. In still another preferable structure of the wiring board with built-in capacitors of the invention, the first upper electrode and the second upper electrode are integrated as a single electrode plate, and the overlapping area between the first lower electrode and the single electrode plate is different from the overlapping area between the second lower electrode and the single electrode plate.

Although in the present specification, descriptions using the terms, "upper," "lower," "right," and "left" shall be given, these terms are merely used for clarifying positional relationships of components. Thus, for example, an "upper" and "lower" relationship may be inverted or a "right" and "left" relationship may be inverted.

BRIEF DESCRIPTION OF THE DRAWINGS

FIG. 10 is a perspective view of first and second capacitors 140 and 240 of another embodiment;

FIG. 11 is a perspective view of first and second capacitors 140 and 240 of another embodiment.

DESCRIPTION OF THE PREFERRED EMBODIMENTS

Figure 1:
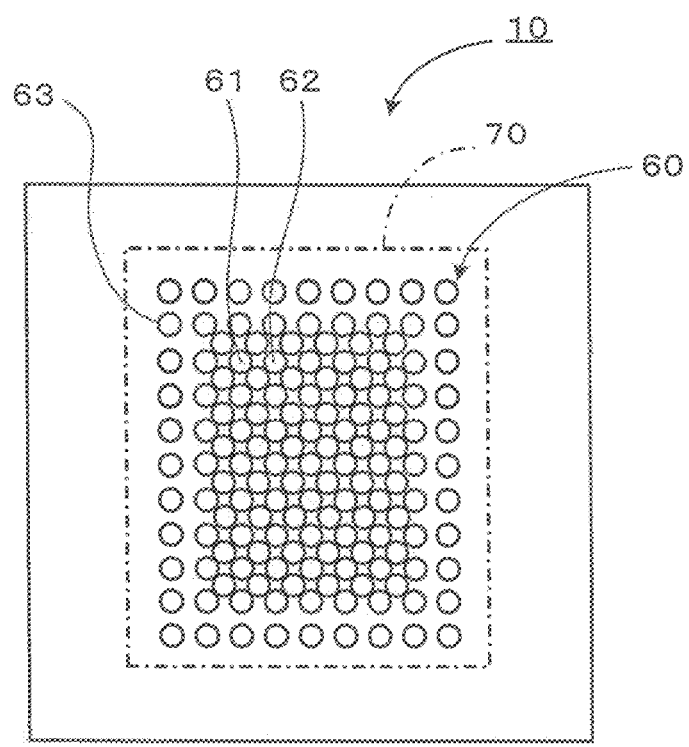
FIG. 1 is a plan view of a multilayer printed wiring board 10.
Figure 2:
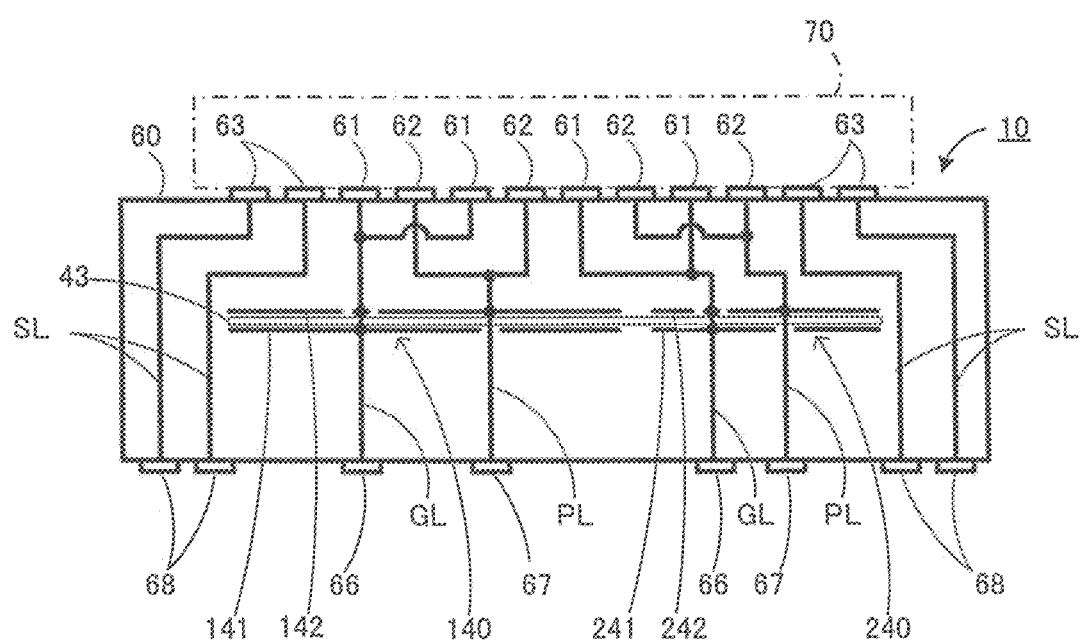
FIG. 2 is a schematic sectional view of the multilayer printed wiring board 10.
Figure 3:
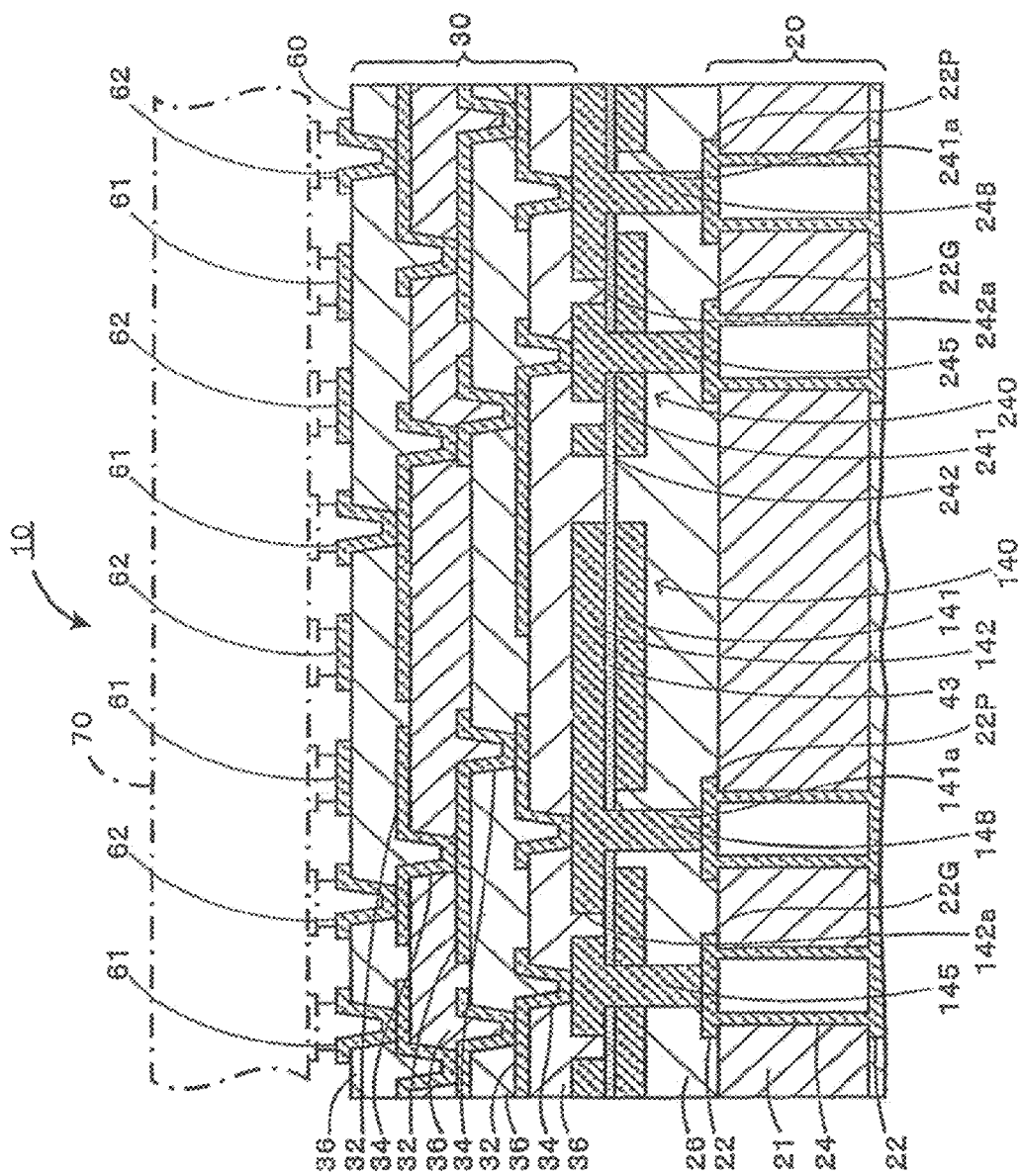
FIG. 3 is a sectional view of principal portions of the multilayer printed wiring board 10.
Figure 4:
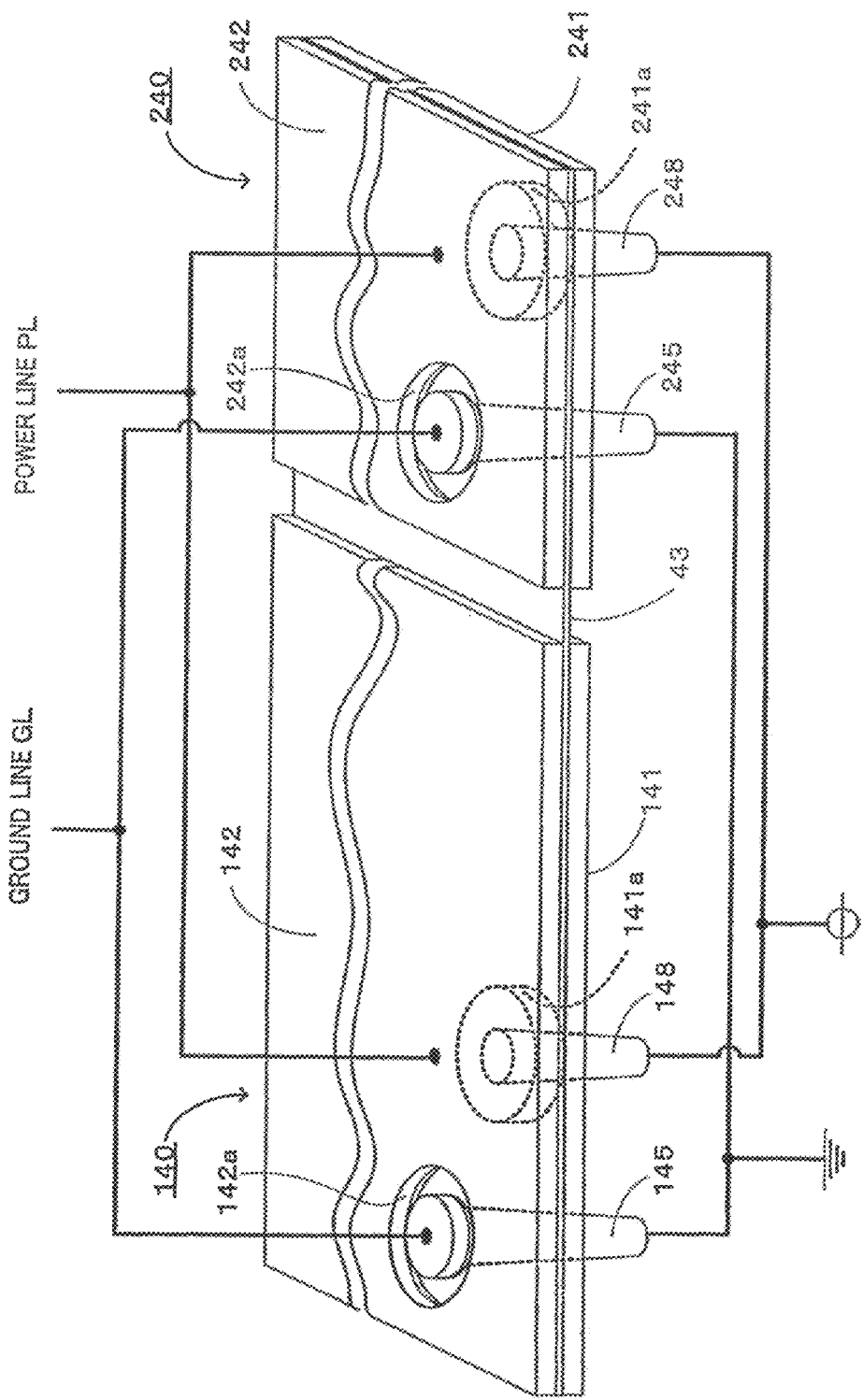
FIG. 4 is a perspective view of first and second capacitors 140 and 240 inside the multilayer printed wiring board 10.

Embodiments of the present invention shall now be described with reference to the drawings. FIG. 1 is a plan view of a multilayer printed wiring board 10 that is a first embodiment according to the present invention, FIG. 2 is a schematic sectional view of the multilayer printed wiring board 10, FIG. 3 is a sectional view of principal portions of the multilayer printed wiring board 10, and FIG. 4 is a perspective view of first and second capacitors 140 and 240 inside the multilayer printed wiring board 10.

The multilayer printed wiring board 10 according to the present embodiment is an example of a wiring board with built-in capacitors according to the present invention. As shown in FIG. 1 and FIG. 2, the multilayer printed wiring board has, on the surface of the board, a mounting portion 60 for mounting an IC chip 70. The mounting portion 60 includes a ground pad 61 connected to a ground line GL that grounds the IC chip 70, a power pad 62 connected to a power line PL that supplies a power supply potential to the IC chip 70, and a signal pad 63 connected to a signal line SL that inputs and outputs signals into and from the IC chip 70. In the present embodiment, ground pads 61 and power pads 62 are arrayed in lattice or staggered form at a central portion of the mounting portion 60, and signal pads 63 are arrayed in lattice form, staggered form, or randomly to surround the arrayed ground pads and power pads. The ground pads 61 are connected, via the ground lines GL that are formed in the interior of the multilayer printed wiring board 10 independently of the power lines PL and the signal lines SL, to external ground terminals 66 formed on the surface at the opposite side of mounting portion 60, and power pads 62 are connected, via the power lines PL that are formed in the interior of the multilayer printed wiring board 10 independently of the ground lines GL and the signal lines SL, to external power terminals 67 formed on the surface at the opposite side of mounting portion 60. The power lines PL are connected to upper electrodes 142 and 242 of first and second capacitors 140 and 240, and the ground lines GL are connected to lower electrodes 141 and 241 of the first and second capacitors 140 and 240. The signal pads 63 are connected, via the signal lines SL that are formed in the interior of the multilayer printed wiring board 10 independently of the power lines PL and the ground lines GL, to external signal terminals 68 formed on the surface at the opposite side of the mounting portion 60. The total number of pads of mounting portion 60 is approximately 1000 to 30000.

The structure of the multilayer printed wiring board 10 shall now be described in more detail with reference to FIG. 3. The multilayer printed wiring board 10 includes a core substrate 20, and the above-mentioned first and second capacitors 140 and 240 that are formed, across an insulating layer 26, on an upper side of core substrate 20, a build-up portion 30 formed on upper sides of first and second capacitors 140 and 240. The multilayer printed wiring board 10 further includes the above-mentioned mounting portion 60 formed on an uppermost layer of build-up layer 30. The respective pads of mounting portion 60 are electrically connected to internal build-up portion conductor layers (BU conductor layers) 32 that are wiring patterns laminated inside the build-up portion 30.

The core substrate 20 includes conductor layers 22 formed of copper on both top and rear surfaces of a main core substrate body 21 that is formed of BT (bismaleimide triazine) resin or glass epoxy substrate, etc., and through hole conductors 24 provided on inner surfaces of through holes which pass through from the top to rear of the main core substrate body 21. The conductor layers 22 on the respective surfaces are electrically connected via the through hole conductors 24.

As shown in FIG. 3 and FIG. 4, the first capacitor 140 includes a dielectric layer 43 that is formed by sintering a ceramic-based high dielectric constant material at high temperature, and the first lower electrode 141 and the first upper electrode 142 that sandwich the dielectric layer 43. The first lower electrode 141 is a nickel electrode that is formed on a lower surface of the dielectric layer 43 and is electrically connected to the ground pad 61 of the mounting portion 60, and the first upper electrode 142 is a copper electrode that is formed on an upper surface of the dielectric layer 43 and is electrically connected to the power pad 62 of the mounting portion 60. The first lower electrode 141 and first upper electrode 142 are thus connected respectively to a ground terminal and a power terminal of the IC chip 70 that is mounted onto the mounting portion 60. The first lower electrode 141 is a solid pattern with a larger area than the second lower electrode 241, and has a circular hole 141a, through which a first upper via hole conductor 148 electrically connecting a power line conductor layer 22P of the conductor layers 22 of the core substrate 20 and the first upper electrode 142 passes in a non-contacting state. Meanwhile, the first upper electrode 142 is formed on a position of the upper surface of dielectric layer 43 that opposes the first lower electrode layer 141. The first upper electrode 142 is a solid pattern that is substantially equivalent in shape and area to the first lower electrode 141, and has a clearance 142a, through which a first lower via hole conductor 145 electrically connecting a ground line conductor layer 22G of the conductor layers 22 of the core substrate 20 and the first lower electrode 142 passes in a non-contacting state. The dielectric layer 43 is made of a single dielectric film and is formed by forming a high dielectric constant material, containing one or more types of metal oxide, selected from the group consisting of $BaTiO_3$, $SrTiO_3$, $TaO_3$, $Ta_2O_5$, PZT, PLZT, PNZT, PCZT, and PSZT, into a thin film of 0.1 to 10 μm and thereafter sintering the film into a ceramic material.

As shown in FIG. 3 and FIG. 4, the second capacitor 140 includes the dielectric layer 43, and second lower electrode 241 and second upper electrode 242 that sandwich the dielectric layer 43. In the second capacitor 240, the second lower electrode 241 is a nickel electrode that is formed on the lower surface of the dielectric layer 43 and is electrically connected to the ground pad 61 of the mounting portion 60, and the second upper electrode 242 is a copper electrode that is formed on the upper surface of the dielectric layer 43 and is electrically connected to the power pad 62 of the mounting portion 60. The second lower electrode 241 and second upper electrode 242 are thus connected respectively to the ground terminal and the power terminal of the IC chip 70 that is mounted onto the mounting portion 60. The second lower electrode 241 is a solid pattern with a smaller area than the first lower electrode 141 and has a circular hole 241a, through which a second upper via hole conductor 248 electrically connecting a power line conductor layer 22P of conductor layers 22 of the core substrate 20 and the second upper electrode 242 passes in a non-contacting state. Meanwhile, the second upper electrode 242 is formed on a position of the upper surface of the dielectric layer 43 that opposes the second lower electrode layer 241. The second upper electrode 242 is a solid pattern that is substantially equivalent in shape and area to the second lower electrode 241, and has a clearance 242a, through which a second lower via hole conductor 245 electrically connecting a ground line conductor layer 22G of the conductor layers 22 of the core substrate 20 and the second lower electrode 242 passes in a non-contacting state.

Figure 5:
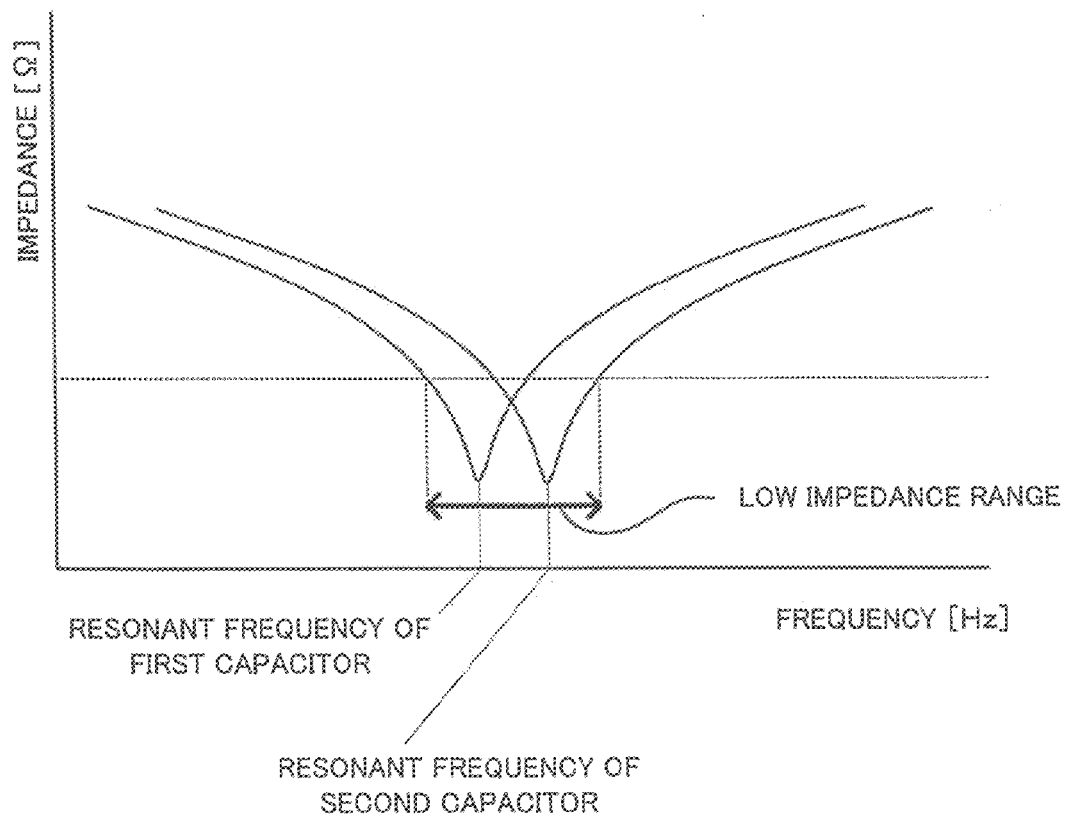
FIG. 5 is a graph showing a relationship between frequency and impedance of the first and second capacitors 140 and 240.

Here, the first and second lower electrodes 141 and 241 are electrodes having substantially the same thickness and are both formed on the upper surface of the insulating layer 26, and the first and second upper electrodes 142 and 242 are electrodes having substantially the same thickness and are both formed on the upper surface of the dielectric layer 43. The capacitance C1 of the first capacitor 140 satisfies the expression $C1=\varepsilon \cdot S1/d$, where S1 represents the area of the first lower electrode 141 and the first upper electrode 142, d represents the thickness of the dielectric layer 43, and E represents the dielectric constant of the dielectric layer 43. In addition, the capacitance C2 of the second capacitor 240 satisfies the expression $C2=\varepsilon \cdot S2/d$, where S2 represents the area of the second lower electrode 241 and second upper electrode 242. Because the area S1 is greater than the area S2, the capacitance C1 of the first capacitor 140 is greater than the capacitance C2 of the second capacitor 240. And, because an equivalent circuit of each of the first and second capacitors 140 and 240 is a parallel LC circuit, the relationship between frequency and impedance the impedance gets to a minimum value at a resonant frequency. Because the resonant frequency is proportional to the reciprocal of the square root of the capacitance, the value of resonant frequency of the first capacitor 140 with the higher capacitance is smaller than that of the second capacitor 240 with the lower capacitance. The relationships between the impedance and the frequency in this case are shown in FIG. 5. In FIG. 5, both the abscissa and the ordinate are of logarithmic scale.

The first and second lower electrodes 141 and 241 and the first and second upper electrodes 142 and 242 may have through holes, through which the respective signal lines pass from top to bottom in a non-contacting state. However, it is more preferable that the respective signal lines are formed at outer sides of the first and second lower electrodes 141 and 241 and the first and second upper electrodes 142 and 242 as shown in FIG. 2.

The buildup portion 30 is lamination of buildup insulating layers (BU insulating layers) 36 and BU conductor layers 32 alternately on the upper side of first and second capacitors 140 and 240. The BU conductor layers 32 are electrically connected to each other across the BU insulating layer 36, and are further electrically connected to the first and second capacitors 140 and 240, by means of BU via hole conductors 34. In consideration of making buildup portion 30 have a fine structure, the thickness of each BU conductor layer 32 is thinner than the thickness of each of the first and second lower electrodes 141 and 241. The mounting portion 60 is formed on the topmost layer of the buildup portion 30. The buildup portion 30 of such structure is formed by any known subtractive method or additive method (including a semi-additive method and a full additive method), and may be formed for example as follows. First, resin sheets that are to become BU insulating layers 36 (with a Young's modulus at room temperature of, for example, 2 to 7 GPa) are adhered onto the top and rear surfaces of the core substrate 20. Each of these resin sheets is formed of a modified epoxy based resin sheet, a polyphenylene ether based resin sheet, a polyimide based resin sheet, or a cyanoester based resin sheet, etc., and the thickness thereof is approximately 20 to 80 μm. The resin sheet may have silica, alumina, zirconia, or other inorganic component dispersed therein. Through holes are then formed in the adhered resin sheets using a carbon dioxide gas laser, UV laser, YAG laser, or excimer laser, etc., and electroless copper plating is applied to the surfaces of the resin sheets and the interiors of the through holes to form conductor layers. Then, plating resists are formed on the conductor layers, electroless copper plating are applied onto portions at which the plating resists are not formed, and thereafter the electroless copper plating below the resists are removed by an etching solution, to obtain BU conductor layers 32. The conductor layers of the interiors of the through holes become the BU via hole conductors 34. The buildup portion 30 is formed by repeating this procedure. In the present embodiment, the first and second lower electrodes 141 and 241 of the first and second capacitors 140 and 240 are formed to be thicker than each of the BU conductor layers 32.

An example of use of the multilayer printed wiring board 10 arranged as described above shall now be described. First, an IC chip 70, having a plurality of solder bumps disposed on a rear surface, is set on the mounting portion 60. In this process, the ground terminals, the power terminals, the signal terminals of IC chip 70 are respectively contacted with the ground pads 61, the power pads 62, and the signal pads 63 of the mounting portion 60. The respective terminals are then bonded by reflow soldering. Thereafter, the multilayer printed wiring board 10 is bonded to a mother board or other printed wiring board. Here, solder bumps are formed in advance on the pads formed on the rear surface of the multilayer printed wiring board 10 and are bonded by reflow while being contacted to the corresponding pads on the other printed wiring board. Because the first and second capacitors 140 and 240 built in the multilayer printed wiring board 10 have dielectric layers 43 formed of ceramic material of high dielectric constant and provide a wider low impedance range in comparison to a case where just a single capacitor is incorporated, an adequate decoupling effect can be exhibited so that transistors of the IC chip 70 (IC) mounted on the mounting portion 60 are not likely to be subject to power shortage, and erroneous operation due to high frequency noise can be prevented as well. If necessary, a chip capacitor of high capacitance may be mounted on a periphery of the mounting portion 60 of the multilayer printed wiring board 10 and be connected in parallel to the first and second capacitors 140 and 240. The power supplying ability can thus be improved further more readily. When a plurality of chip capacitors are to be mounted, the low impedance range can be widened more readily by differing the capacitances of the respective chip capacitors.

A procedure of manufacturing the multilayer printed wiring board 10 according to the present embodiment shall now be described with reference to FIG. 6 to FIG. 9. First, a high dielectric constant sheet 340 (see FIG. 6A), which includes a dielectric layer 43, a lower electrode 41 formed of nickel and covering the entire lower surface of the dielectric layer 43, and an upper electrode 42 formed of copper and covering the entire upper surface of dielectric layer 43, is prepared by the following procedure.

(1) Barium diethoxide and titanium bi-tetraisopropoxide, each of which is weighed out to realize a concentration of 1.0 mole/liter, are dissolved in a mixed solvent of dehydrated methanol and 2-methoxyethanol (volume ratio: 3:2), and the solution is stirred for three days under a nitrogen atmosphere at room temperature to prepare a barium and titanium alkoxide precursor composition solution. This precursor composition solution is then stirred while being maintained at 0° C., and water, which has been decarbonated in advance, is sprayed on at a rate of 0.5 microliters/minute in a nitrogen gas flow to perform hydrolysis.

(2) The sol-gel solution thus prepared is passed through a 0.2 micron filter to filter out precipitates, etc.

(3) The filtrate prepared in (2) above is spin coated at 1500 rpm for 1 minute onto lower electrode 41 formed of nickel and having a thickness of 14 µm, and the substrate resulting from the spin coating of the solution is dried by placing for 3 minutes on a hot plate maintained at 150° C. Thereafter, the substrate is inserted in an electric oven maintained at 850° C. and sintered for 15 minutes. Here, the viscosity of the sol-gel solution is adjusted so that the thickness of the film obtained by the first spin coating, drying, and sintering is 0.03 µm. Besides nickel, lower electrode 41 may be formed of copper, platinum, gold, or silver, etc.

(4) A series of the spin coating, drying, and sintering is repeated 25 times to obtain a dielectric layer 43 having a thickness of 0.75 µm.

(5) Thereafter, using a sputtering device or other vacuum vapor deposition device, a copper layer is formed on the dielectric layer 43, and approximately 10 µm of copper is added onto this copper layer by electroless plating, etc., to form an upper electrode 42 of substantially the same thickness as lower electrode 41. The dielectric characteristics of the high dielectric constant sheet 340 that is thus obtained can be measured using an impedance/gain phase analyzer (product name: 4194A, made by Hewlett Packard Inc.) at conditions of a frequency of 1 kHz, a temperature of 25° C., and an OSC level of 1V. The specific dielectric constant is approximately 1300. A metal layer of platinum or gold, etc., besides copper, may be formed by the vapor deposition, and a metal layer of nickel, tin, etc., besides copper, may be formed by the electroless plating. Though the dielectric layer 43 is formed of barium titanate here, the dielectric layer may be formed of any one of strontium titanate ($SrTiO_3$), tantalum oxide ($TaO_3$, $Ta_2O_5$), lead zirconate titanate (PZT), lead lanthanum zirconate titanate (PLZT), lead niobium zirconate titanate (PNZT), lead calcium zirconate titanate (PCZT), and lead strontium zirconate titanate (PSZT) by using another sol-gel solution.

The following is another method for preparing high dielectric constant sheet 340. First, a barium titanate powder (HPBT Series, made by Fuji Titanium Industry Co., Ltd.) is dispersed in a binder solution, prepared by mixing 5 weight parts of polyvinyl alcohol, 50 weight parts of pure water, and 1 weight part of dioctyl phthalate or dibutyl phthalate as a solvent-based plasticizer with respect to the total weight of barium titanate powder, and the dispersion is printed as a thin film of approximately 5 to 7 µm thickness onto lower electrode 41 formed of nickel and having a thickness of 14 µm by using a roll coater, doctoring blade, a coater or other printing machine, and is dried for 1 hour at 60° C., 3 hours at 80° C., 1 hour at 100° C., 1 hour at 120° C., and 3 hours at 150° C. to prepare an unsintered layer. Besides $BaTiO_3$, a paste containing one or two or more types of metal oxide, selected from the group consisting of $SrTiO_3$, $TaO_3$, $Ta_2O_5$, PZT, PLZT, PNZT, PCZT, and PSZT may be printed as a thin film of 0.1 to 10 µm thickness using a roll coater, doctoring blade, or other printing machine and dried to an unsintered layer. After the printing, the unsintered layer is sintered at a temperature range of 600 to 950° C. to form a dielectric layer 43. Thereafter, a copper layer is formed on the dielectric layer 43 using a sputtering device or other vacuum vapor deposition device, and approximately 2 to 10 µm of copper is added onto this copper layer by electroless plating, etc., to from an upper electrode 42 of substantially the same thickness as lower electrode 41. Besides copper, a metal layer of platinum or gold, etc., may be formed by the vapor deposition, and besides copper, a metal layer of nickel, tin, etc., may be formed by the electroless plating. A sputtering method using barium titanate as a target may be instead employed.

Figure 6A:
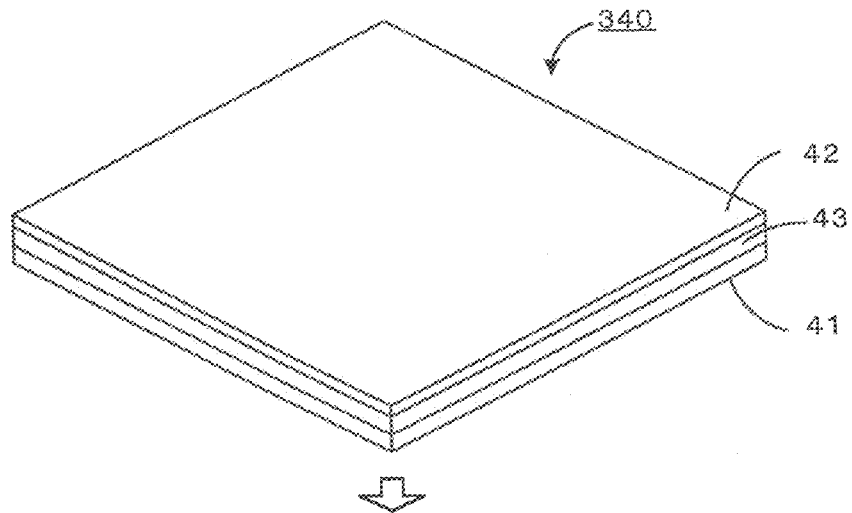
FIG. 6 show explanatory drawings of a process of manufacturing the multilayer printed wiring board 10, where FIG. 6A being a perspective view of a high dielectric constant sheet 340, FIG. 6B being a perspective view of a state after processing a lower electrode 41, and FIG. 6C being a sectional view taken on A-A of FIG. 6B.
Figure 6B:
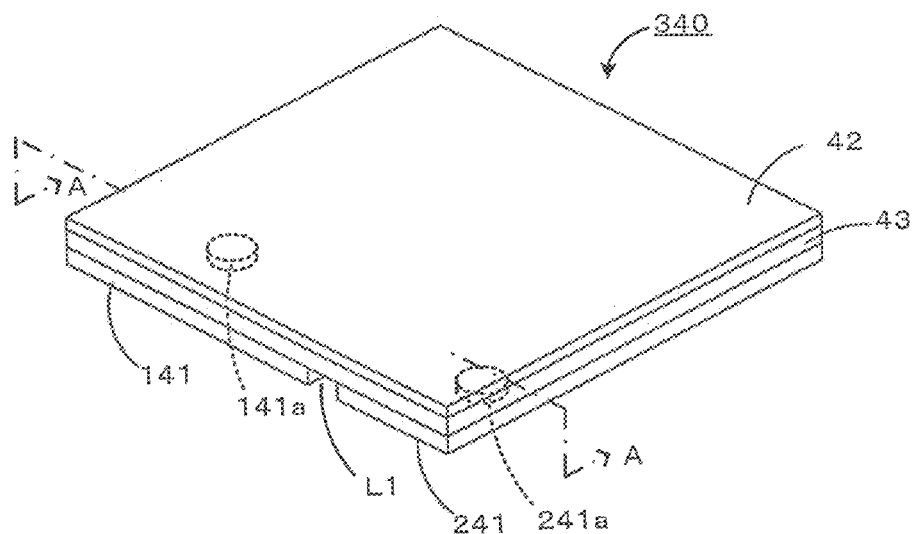
Figure 6C:
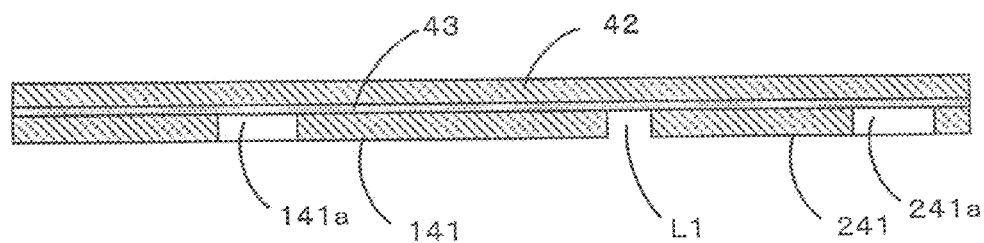

Then, as shown in FIGS. 6B and 6C, the lower electrode 41 of the high dielectric constant sheet 340 is partitioned into first lower electrode 141 and second lower electrode 241 by a rectilinear groove L1, and circular holes 141a and 241a are formed. FIG. 6C is a sectional view taken on A-A of FIG. 6B. Here, a method for partitioning the lower electrode 41 shall be described. First, a resist is provided onto lower electrode 41 and exposed and developed via a photomask to from a resist pattern that covers regions besides rectilinear groove L1 that is to be formed. Then, the portion of the lower electrode 41 that is not covered by the resist is removed through treatment by etching solution to thereby form a rectilinear groove L1, and thereafter, the resist is removed. The circular holes 141a and 241a are likewise formed by a photographic method (tenting method). As a result, the first lower electrode 141 and the second lower electrode 241 is partitioned by the rectilinear groove L1. Here, the groove width of rectilinear groove L1 is set to a width by which the isolation of the adjacent first lower electrode 141 and second lower electrode 142 with respect to each other is maintained when the rectilinear groove L1 is filled with an insulating resin. In the etching step, a cupric chloride etching solution may be used.

Figure 7A:
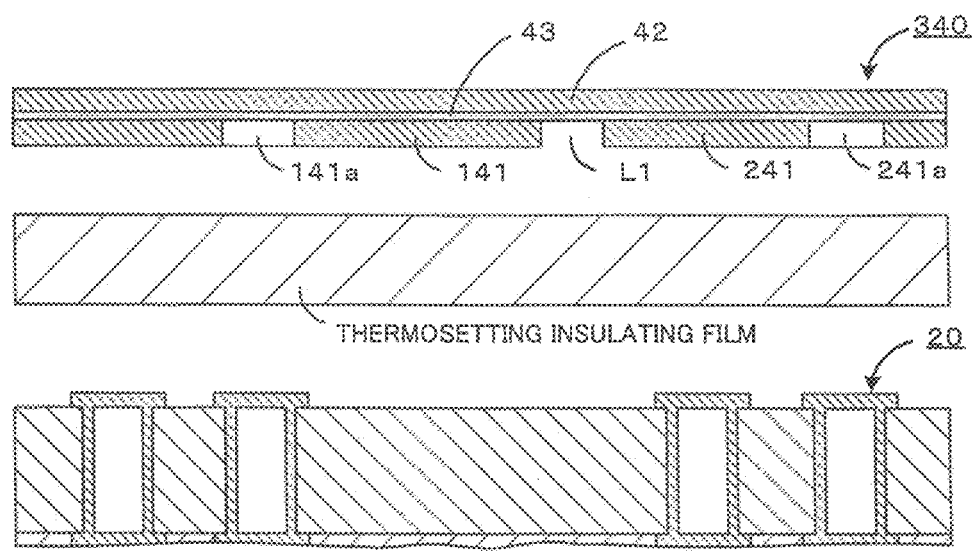
FIG. 7 show explanatory drawings of the process of manufacturing the multilayer printed wiring board 10.
Figure 7B:
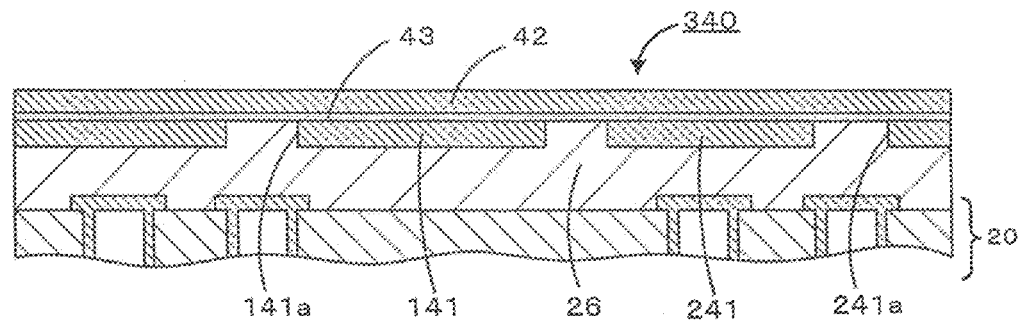
Figure 8A:
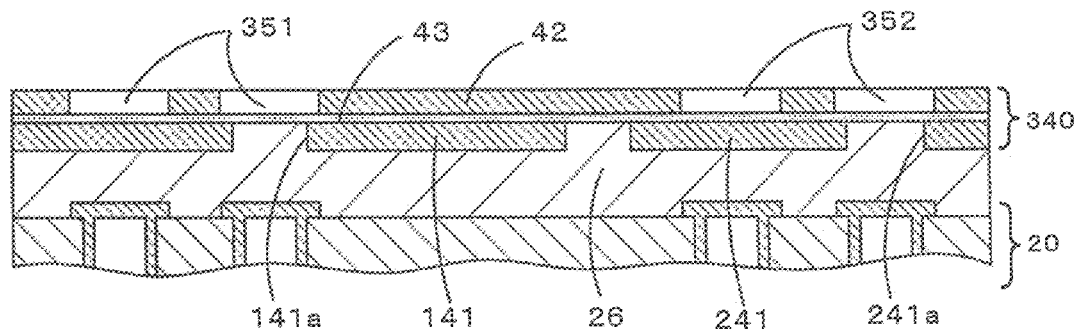
FIG. 8 show explanatory drawings of the process of manufacturing the multilayer printed wiring board 10.
Figure 8B:
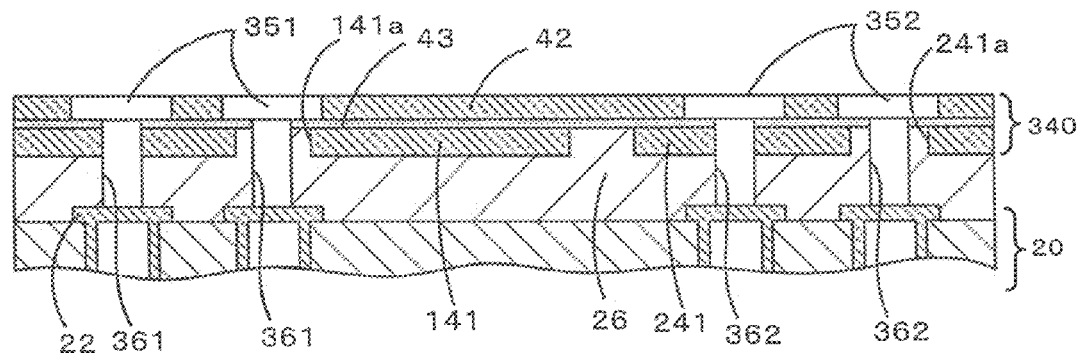
Figure 8C:
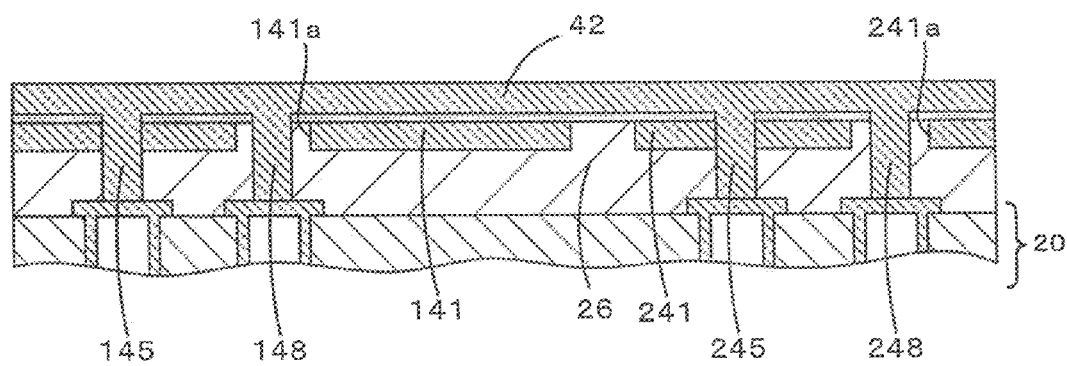

Next, as shown in FIG. 7A, the high dielectric constant sheet 340 is adhered onto the core substrate 20, which is prepared in advance, via a thermosetting resin film (ABF-45SH, made by Ajinomoto Co., Inc.) under lamination conditions of a temperature of 50 to 150° C. and a pressure of 0.5 to 1.5 MPa, and cured at 150° C. to 170° C. for 1 hour. The thermosetting insulating film is thereby hardened and becomes an insulating layer 26. The board at this stage of the manufacturing method is shown in FIG. 7B. The surfaces of first and second lower electrodes 141 and 241 of the high dielectric constant sheet 340 are preferably roughened bym for example, an inter-plate process (made by Ebara-Udylite Co., Ltd.).

A commercially available etching resist (dry film) is then adhered onto the wiring board in middle of preparation on which the high dielectric constant sheet 340 has been laminated, and a pattern is formed on the etching resist by exposure and development that is normally performed to form a pattern on a multilayer printed wiring board. After patterning, the portions on which the etching resist is not formed are removed by etching and then the etching resist is removed to form circular holes 351 and 352 (see FIG. 8A). For example, a cupric chloride etching solution may be used in the etching step. The circular holes 351 are formed at positions corresponding to positions at which first lower via hole conductor 145 and first upper via hole conductor 148 in FIG. 3 are to be formed, and the circular holes 352 are formed at the positions corresponding to positions at which second lower via hole conductor 245 and second upper via hole conductor 248 in FIG. 3 are to be formed. A UV laser is radiated onto positions at which the circular holes 351 and 352 are formed, to form via holes 361 and 362 which pass through the high dielectric constant sheet 340 and reach the conductor layers 22 positioned the below high dielectric constant sheet 340 (see FIG. 8B). The via holes may be formed instead by radiating the UV laser, etc., directly onto the upper electrode 42 without providing circular holes 351 and 352.

Then, after applying an electroless plating catalyst onto the surface of the wiring board (including the bottom surface and peripheral walls of the respective circular holes 351 and 352 and the respective via holes 361 and 362), the wiring board is immersed in an aqueous electroless copper plating solution to form an electroless copper plating film (not shown) of 0.6 to 3.0 µm thickness on the wiring board. An example of composition of the aqueous electroless plating solution includes 0.03 mol/L of copper sulfate, 0.200 mol/L of EDTA, 0.1 g/L of HCHO, 0.1 mol/L of NaOH, 100 mg/L of α-α'-bipyridyl, and 0.1 g/L of polyethylene glycol (PEG). After that, an electroless copper plating film of 25 µm thickness is formed on the electroless copper plating film, and the respective circular holes 351 and 352 and the respective via holes 361 and 362 are filled with copper. Thus, portions of the copper filled in via holes 361, which is in contact with the first lower electrode 141, becomes first lower via hole conductor 145. And other portions of the copper filled in via holes 361, which is not in contact with the first lower electrode 141, becomes first upper via hole conductor 148. Portions of the copper filled in via holes 362, which is in contact with second lower electrode 241, becomes second lower via hole conductor 245. And portions of the copper filled in via holes 362, which is not in contact with second lower electrode 241, becomes first upper via hole conductor 248 (see FIG. 8C). An example of composition of the aqueous electroless plating solution includes 200 g/L of sulfuric acid, 80 g/L of copper sulfate, and 19.5 ml/L of additive (Cupracid GL, made by Atotech Japan). The electroless copper plating can be performed under the conditions that current density of 0.5 to 2 A/dm$^2$, duration of 60 to 115 minutes, and temperature at 23±2° C.

Figure 9A:
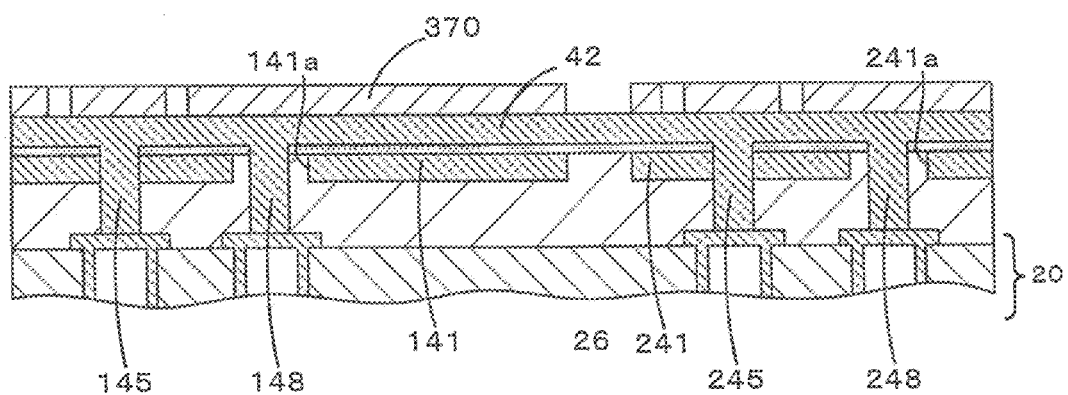
FIG. 9 show explanatory drawings of the process of manufacturing the multilayer printed wiring board 10.
Figure 9B:
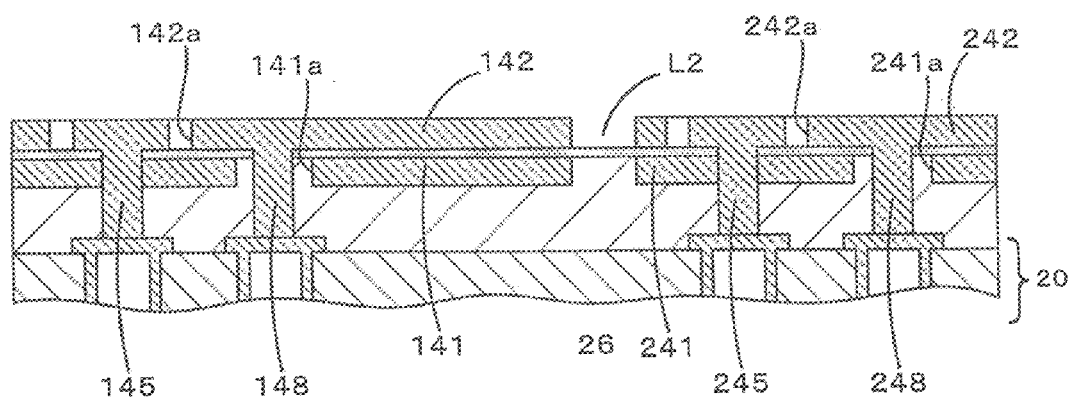

An etching resist (dry film) is then adhered onto the electroless copper plating film and is patterned (see FIG. 9A). Portions at which the etching resist is not formed after patterning are a portion corresponding to a rectilinear groove L2 that partitions upper electrode 42 into first upper electrode 142 and second upper electrode 242, a portion corresponding to a donut-like clearance 142a for isolating first lower via hole conductor 145 from upper electrode 42, and a portion corresponding to a donut-like clearance 242a for isolating second lower via hole conductor 245 from upper electrode 42. The copper present at the portions at which the etching resist is not formed is removed to from rectilinear groove L2 and clearances 142a and 242a (see FIG. 9B). Thus, the upper electrode 42 is thereby partitioned into first upper electrode 142 and second upper electrode 242, the first lower via hole conductor 145 is isolated from the first upper electrode 142, and the second lower via hole conductor 245 is isolated from the second upper electrode 242. The etching resist is thereafter removed. By these steps, the first and second capacitors 140 and 240 are formed on the core substrate 20. Thereafter, buildup portion 30 is laminated by the method described in paragraph [0021]. In this process, electrodes that are to be the respective pads 61 and 62 are formed on the uppermost layer of the buildup portion 30, and a multilayer printed wiring board 10, illustrated in FIG. 1 to FIG. 3, is thereby completed.

In the multilayer printed wiring board 10 described above, because the first and second capacitors 140 and 240, which differ in capacitance, are connected in parallel between the power line PL and the ground line GL, the respective resonant frequencies differ as shown in FIG. 5 and the impedance is restrained to a low level across a broad frequency range. In addition, because the dielectric layer 43 of substantially uniform thickness is used, the dielectric constant layer 43 can be formed readily in the middle of forming the multilayer wiring structure and the decoupling capacitors can be formed readily in comparison to the case of using dielectric layers that differ in thickness according to each capacitor.

In the dielectric layer 43, a single dielectric film is used to prepare both of the first capacitors 140 and the second capacitors 240. The trouble of partitioning an electric film is eliminated and the manufacturing process is thus simplified in comparison to the case of using dielectric layers that are respectively partitioned for the lower electrodes and upper electrodes of the respective capacitors 140 and 240.

Because the dielectric layer 43 uses a sintered ceramic body, the dielectric constant $\in$ can be adequately high. The respective decoupling capacitors can thus be high in capacitance and thereby the dielectric layer 43 is allowed to function as charge supply sources for accommodating instantaneous lowering of the power supply voltage as well as for reinforcing the signal power supply.

The present invention is not restricted to the above-described embodiment and can obviously be put into practice in various modes within the technical scope of the invention.

In the above embodiment, the area of first lower electrode 141 and the area of first upper electrode 142 are made substantially the same, and the two electrodes 141 and 142 are made to oppose each other in the first capacitor 140. Similarly, the area of second lower electrode 241 and the area of second upper electrode 242 are made substantially the same, and the two electrodes 241 and 242 are made to oppose each other in the second capacitor 240. However, the area of first lower electrode 141 and the area of first upper electrode 142 do not necessarily have to be substantially the same dimension. For example, as shown in FIG. 10, the area of first lower electrode 141 may be greater than the area of first upper electrode 142, and the area of second lower electrode 241 may be greater than the area of second upper electrode 242. Here, the overlapping area between first lower electrode 141 and first upper electrode 142 is made different from the overlapping area between second lower electrode 241 and second upper electrode 242. Because the first and second capacitors 140 and 240 differ in capacitance in this case as well, the same effects as those of the above embodiment are achieved. Also, the first capacitor 140 shown in FIG. 4 may be combined with the second capacitor 240 shown in FIG. 10, or the first capacitor 140 shown in FIG. 10 may be combined with the second capacitor 240 shown in FIG. 4. Furthermore, which of the upper and lower electrode areas is to be larger may be determined arbitrarily. In all cases, the first and second capacitors 140 and 240 are made to differ in capacitance.

In the above embodiment, the first lower electrode 141 of the first capacitor 140 and the second lower electrode 241 of the second capacitor 240 are disposed apart from each other, and the first upper electrode 142 of the first capacitor 140 and the second upper electrode 242 of the second capacitor 240 are disposed apart from each other. However, the electrodes do not necessarily have to be disposed separately at both the upper and lower sides. For example, as shown in FIG. 11, the lower electrode 41 may be arranged as a single electrode plate and the first upper electrode 142 and the second upper electrode 242 may be disposed separately. In this case, the overlapping area between first upper electrode 241 and lower electrode 41 is made to differ from the overlapping area between second upper electrode 242 and lower electrode 41. Because first and second capacitors 140 and 240 are made to mutually differ in capacitance in this arrangement as well, the same effects as those of the above embodiment are achieved. Oppositely, the first lower electrode 141 and the second lower electrode 241 may be disposed apart from each other, the upper electrode may be arranged as a single electrode plate, and the overlapping area between first lower electrode 141 and the upper electrode may be made to differ from the overlapping area between second lower electrode 241 and the upper electrode.

Figure 12:
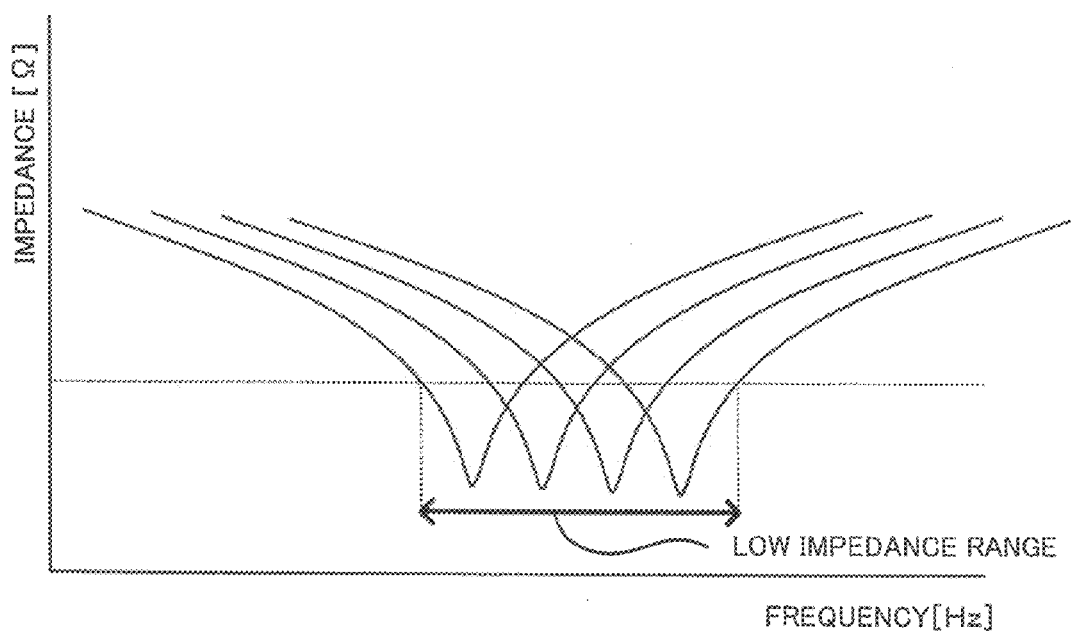
FIG. 12 is a graph showing a relationship between frequency and impedance of a capacitor of another embodiment.

In the above embodiment, the first and second capacitors 140 and 240 are connected in parallel between the power line PL that supplies power to the IC chip 70 and the ground line GL that grounds the IC chip 70. In one modified arrangement, three or more capacitors that differ in capacitance may be connected in parallel between the power line PL and the ground line GL. When four capacitors that differ in capacitance are connected in parallel, for example, the low impedance range can be widened further as shown in FIG. 12.

In the above embodiment, the high dielectric element sheet 340 is used to build the first and second capacitors 140 and 240 in the multilayer printed wiring board 10. The first and second capacitors 140 and 240 may be built in the multilayer printed wiring board 10 by using a buildup method instead. For example, a metal film is formed by plating, etc. on the insulating layer 26 and is exposed and developed to form a first lower electrode 141 and a second lower electrode 241, a dielectric layer of substantially uniform thickness may then be laminated onto the electrodes, and a metal film is formed by plating, etc. on the dielectric layer and exposed and developed to form a first upper electrode 142 and a second upper electrodes 242.

In the above embodiment, a single dielectric layer 43 is used to prepare both the first capacitor 140 and the second capacitor 240. However, the dielectric layer of first capacitor 120 and the dielectric layer of second capacitor 240 may be separately disposed in parallel instead.

In the above embodiment, the cross-sectional shape of the BU via hole conductor 34 is a cup-like shape (a so-called conformal via). The BU via hole conductor 34 may be a so-called filled via, with which a metal or conductive resin is filled into the cup.

In the above embodiment, the first and second lower electrodes 141 and 241 of the first and second capacitors 140 and 240 are connected to the ground line GL, and the first and second upper electrodes 142 and 242 are connected to the power line PL. In one modified structure, the first and second lower electrodes 141 and 241 of the first and second capacitors 140 and 240 may be connected to the power line PL, and the first and second upper electrodes 142 and 242 may be connected to the ground line GL.

What is claimed is:

1. A wiring board with built-in capacitors, comprising:
a core substrate; and
a high dielectric sheet positioned on the core substrate and comprising a lower electrode layer, an upper electrode layer and a dielectric layer, the dielectric layer comprising a single sintered ceramic body in a form of a single film and sandwiched between the lower electrode layer and the upper electrode layer, at least one of the lower electrode layer and the upper electrode layer being partitioned into a plurality of electrodes such that the high dielectric sheet has a plurality of capacitors,
wherein one of the lower electrode layer and the upper electrode layer is connected to a ground line and the other one of the lower electrode layer and the upper electrode layer is connected to a power line such that the capacitors are electrically connected in parallel.

2. The wiring board according to claim 1, wherein the lower electrode layer has a roughened surface.

3. The wiring board according to claim 2, wherein the roughened surface of the lower electrode layer is formed by an inter-plate process.

4. The wiring board according to claim 1, wherein only the lower electrode layer is partitioned into the plurality of electrodes.

5. The wiring board according to claim 1, wherein, in the partitioning, only the upper electrode layer is partitioned into the plurality of electrodes.

6. The wiring board according to claim 1, wherein the upper electrode layer and the lower electrode layer are partitioned into the plurality of electrodes, respectively.

7. The wiring board according to claim 1, wherein the single sintered ceramic body of the dielectric layer comprises a film of a high dielectric constant material comprising at least one metal oxide selected from the group consisting of $BaTiO_3$, $SrTiO_3$, $TaO_3$, $Ta_2O_5$, PZT, PLZT, PNZT, PCZT and PSZT.

8. The wiring board according to claim 1, further comprising a plurality of via hole conductors electrically connected to the electrodes of the capacitors.

9. The wiring board according to claim 1, wherein at least one of the upper electrode layer and the lower electrode layer has at least one groove dividing the at least one of the upper electrode layer and the lower electrode layer.

10. The wiring board according to claim 9, wherein the at least one groove is formed by etching at least one of the upper electrode layer and the lower electrode layer.

11. The wiring board according to claim 1, further comprising:
a build-up portion formed on the core substrate such that the plurality of capacitors is positioned between the core substrate and the build-up portion.

12. The wiring board according to claim 1, further comprising:
a build-up portion formed on the core substrate such that the plurality of capacitors is positioned between the core substrate and the build-up portion; and an IC chip mounted on an mounting portion of the build-up portion.

\* \* \* \* \*